United States Patent
Padattil

(10) Patent No.: US 7,145,789 B2
(45) Date of Patent: Dec. 5, 2006

(54) LOW POWER LOW AREA PRECHARGE TECHNIQUE FOR A CONTENT ADDRESSABLE MEMORY

(75) Inventor: Kuliyampattil Nisha Padattil, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 139 days.

(21) Appl. No.: 11/029,927

(22) Filed: Jan. 5, 2005

(65) Prior Publication Data

US 2006/0146585 A1    Jul. 6, 2006

(51) Int. Cl.
*G11C 15/00*    (2006.01)
*G11C 7/00*    (2006.01)
(52) U.S. Cl. .................. 365/49; 365/194; 365/203; 365/204
(58) Field of Classification Search .................. 365/49, 365/194, 203, 204
See application file for complete search history.

(56) References Cited

U.S. PATENT DOCUMENTS

| | | | |
|---|---|---|---|
| 6,430,073 B1* | 8/2002 | Batson et al. ................. 365/49 |
| 6,539,466 B1* | 3/2003 | Riedlinger ................... 711/207 |
| 6,580,628 B1* | 6/2003 | Barnes ......................... 365/49 |
| 6,775,168 B1* | 8/2004 | Park et al. .................... 365/49 |

* cited by examiner

*Primary Examiner*—Son T. Dinh
(74) *Attorney, Agent, or Firm*—Alan K. Stewart; W. James Brady, III; Frederick J. Telecky, Jr.

(57) ABSTRACT

A technique to pre-charge a CAM block array including a plurality of CAM blocks that is organized into at least one rectangular array having rows each having a plurality of CAM blocks, an associated GMAT line, an associated LMAT line, and a group of CAM cells. The pre-charge technique of the present invention accommodates for all CAM block configurations without compromising performance at the cost of silicon area. In one example embodiment, this is accomplished by precharging each LMAT line in the CAM block array. A predetermined amount of delay is then applied substantially after precharging each LMAT line. Each GMAT line in the CAM block array is then precharged.

23 Claims, 3 Drawing Sheets

LOW POWER LOW AREA PRECHARGE TECHNIQUE FOR A CONTENT ADDRESSABLE MEMORY

TECHNICAL FIELD OF THE INVENTION

The present invention relates generally to digital integrated circuits, and more particularly relates to content addressable memories (CAMs).

BACKGROUND OF THE INVENTION

Content addressable memory (CAM) arrays are commonly used in cache systems, and other address translation systems, of high speed computing systems. They are also useful in high-speed network routers, and many other applications known in the art of computing.

The CAM arrays typically are comprised of a plurality of rows, each row having multiple CAM blocks and each CAM block has plurality of CAM cells. The CAM arrays are characterized by circuitry capable of generating a "local match" output for each CAM block in a row and a "global match" output for each row of CAM blocks in the CAM arrays indicating whether any location of the array contains a data pattern matching a query input and the identity of that location. Each CAM cell of a CAM array typically has the ability to store a unit of data, and the ability to compare that unit of data with a unit of a query input. Each CAM block has the ability to generate the local match output. A compare result indication of each CAM block, which is a local match (LMAT) signal, in a row is combined to produce a global match (GMAT) signal for the row to indicate whether the row of CAM cells contains a stored word matching a query input. The GMAT signals from each row in the CAM array together constitute global match output signals of the array; these signals may be encoded to generate the address of matched locations or used to select data from rows of additional memory.

Each CAM cell in each CAM block of each column in the CAM array is typically connected to a common write bit line. The common write bit line is used to read and write the data from/to a memory cell, which are selected using a generated address.

Further, each CAM cell in each CAM block of each column in the CAM arrays are typically connected to a common query data line, also referred to as a common compare data line. The common compare data line allows enabling simultaneous data searching in each CAM cell in a column from a query input. The common compare data line can also be used as a write data line.

The unit of data stored in a CAM array cell is often binary, having two possible states: logic one, and logic zero. The CAM blocks of these arrays produce a local match compare result if the query input is equal to the data stored in the CAM cells in the CAM blocks, and a mismatch result otherwise. Whereas, TCAM (ternary CAM) cells can store three states: logic one, logic zero, and don't care. TCAM blocks of these TCAM arrays produce a local match compare result if the query input is either equal to the data stored in the CAM cells in the TCAM blocks, the query input contains a don't care state, or the data stored is a don't care data. The TCAM arrays produce a mismatch result otherwise. The TCAM arrays are particularly useful in address translation systems that allow variably sized allocation units.

As described above, in a conventional CAM array, each of the TCAM cells in a CAM block is connected to an associated LMAT line. Each LMAT line is connected to an associated GMAT line in a row via a GMAT evaluation transistor. Further, each CAM block includes a conversion circuit, which performs the LMAT to GMAT signal conversion and preconditioning of the LMAT and GMAT lines. Each conversion circuit includes an LMAT precharge transistor that is connected between a supply voltage VDD and the associated LMAT line, a GMAT evaluation transistor that is connected between the supply voltage VDD and the GMAT associated line, and a GMAT predischarge transistor that is connected between the GMAT line and ground.

Before a search cycle, the LMAT line is kept at a logic high voltage and the GMAT line is kept at a logic low voltage. When a TCAM cell is queried, if there is a mismatch between a stored word and a compare word, the LMAT line is discharged to a logic low voltage via the TCAM cell. If there is no mismatch between the stored word and the compare word then the LMAT line remains at a logic high voltage. If at lest one of the LMAT lines in a row is discharged due to a mismatch, the corresponding GMAT line is evaluated to a logic high voltage. If all the LMAT lines in a row remain at a logic high voltage indicating a match, then the associated GMAT line remains in the logic low voltage. Before the start of a next search cycle, the LMAT line, which may go to a logic low voltage due to the mismatch, has to be precharged back to a logic high voltage and the associated GMAT line has to be predischarged to a logic low voltage. During the precharge operation, if the GMAT predischarge transistor is enabled and if any of the associated LMAT lines are still at the logic low voltage, then there will be a direct path from the VDD to ground via the GMAT evaluation transistor and the GMAT predischarge transistor, such a path is commonly referred to as a "crowbar" path, which can result in significant power consumption for each mismatch condition, a large crowbar current can occur which can result in large surges.

Further, as the number of CAM cells in each CAM block of a CAM array increases; capacitive loading on the match lines increases accordingly. As loading on the match lines increases, the current required to charge the match lines toward the supply voltage increases. Accordingly, as CAM words are widened, for example, to accommodate longer Internet addresses, power consumption resulting from charging the match lines during compare operations may significantly increase.

In order to avoid the crowbar path, in the conventional CAM array, the precharge sequencing is generally performed using a fixed delay between the pre-charging of the LMAT line and the GMAT line on a row-by-row basis. Using such a fixed delay assures that the GMAT is precharged only after an associated LMAT line is precharged. Generally, such fixed delays are designed for use in large CAM array configurations because the fixed delay has to be increased as the GMAT line length increases. Further, as the number of columns in the CAM array increases due to an increase in the number of bits to be stored in the TCAM cells, the LMAT line and the GMAT line length also increases. This necessitates using a very high fixed delay to accommodate for a large CAM configuration that can be required in a compiler memory.

Using such a high fixed delay can result in an increased cycle time and a significant reduction in performance. Especially when using smaller CAM array configurations in compiler memories, since the same control block having the high fixed delay is used for all compiler memory configurations.

Typically, to precharge a large GMAT line, a large precharge transistor device is required. However, using such a large precharge transistor device can be inefficient for large CAM array configurations.

In addition, in a conventional CAM array, GMAT predischarge transistors are located at one end of each row in the CAM array. To precharge the GMAT lines, large GMAT precharge drivers are used at the end of long GMAT lines (Resistor-Capacitance line). Using such large GMAT predischarge drivers is generally less efficient and can result in requiring larger predriver chains.

SUMMARY OF THE INVENTION

According to an aspect of the subject matter, there is provided a method for pre-charging a CAM block array, the method including the steps of, precharging each LMAT line of the CAM block array, applying a predetermined amount of delay substantially after precharging each LMAT line, and precharging each GMAT line in the CAM block array.

DETAILED DESCRIPTION OF THE INVENTION

In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1:
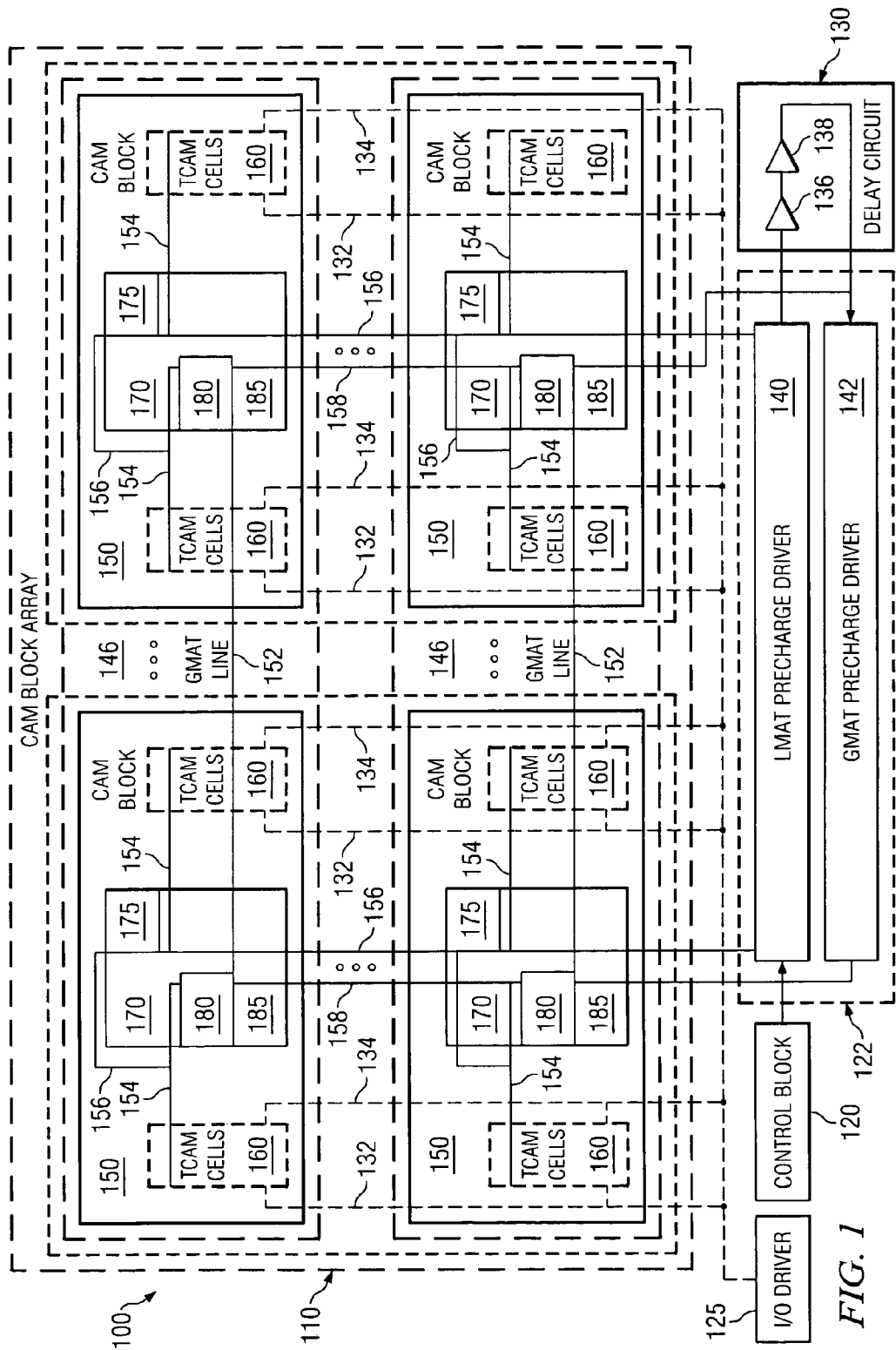
FIG. 1 is a schematic diagram of a CAM according to an embodiment of the present invention.

Referring now to FIG. 1, there is illustrated an example embodiment of a CAM 100 according to the present invention. The CAM 100 includes a CAM block array 110, a control block 120, a delay circuit 130, a precharge driver 122, and an input output (I/O) driver 125. As shown in FIG. 1, the precharge driver 122 includes an LMAT precharge driver 140 and a GMAT precharge driver 142.

Further as shown in FIG. 1, the CAM block array 110 includes multiple CAM blocks 150 which are organized into at least one rectangular array having rows each having a plurality of CAM blocks 146. Each of the plurality of CAM blocks 146 has an associated GMAT line 152. Each column in the rectangular array has a compare data line 132 and a compare complement data line 134, which are connected to each of the associated plurality of TCAM cells 160 in a column. Each of the multiple CAM blocks 150 is associated with a row and a column of the CAM block array 110. Further as shown in FIG. 1, the plurality of TCAM cells 160 in each of the multiple CAM blocks 150 are connected to an associated LMAT line 154. In some embodiments, the plurality of TCAM cells 160 is a plurality of CAM cells. Further as shown in FIG. 1, each compare data line 132 and the compare complement data line 134 are connected to the I/O driver 125.

In addition, each of the multiple CAM blocks 150 includes a conversion circuit 170. Each conversion circuit 170 includes at least one LMAT precharge transistor 175, at least one GMAT evaluation transistor 180, and a GMAT predischarge transistor 185. In some embodiments, the at least one LMAT precharge transistor 175 is a pull-up LMAT PMOS transistor, the at least one GMAT evaluation transistor 180 is a pull-up GMAT PMOS transistor, the GMAT predischarge transistor 185 is a GMAT NMOS predischarge transistor. As shown in FIG. 1, each LMAT line 154 is further connected to the associated GMAT line 152 via the conversion circuit 170. In some embodiments, each of the plurality of TCAM cells 160 includes at least one memory element for storing a data bit and at least one comparison circuit for comparing the stored data bit with a received compare data bit.

Also as shown in FIG. 1, each column includes an LMAT precharge signal line 156 that connects to each of the at least one LMAT precharge transistors 175. Furthermore as shown in FIG. 1, each column includes a GMAT precharge signal line 158 that connects to each of the GMAT predischarge transistor 185.

Moreover as shown in FIG. 1, the delay circuit 130 is connected between the LMAT precharge signal line 156 and the GMAT precharge signal line 158. In some embodiments, the delay circuit 130 includes a first inverter and a second inverter 136 and 138, respectively. Each of the first and second inverters 136 and 138 has an input and an output. In these embodiments, the input of the first inverter 136 is connected to the LMAT precharge signal line 156 via the LMAT precharge driver 140, the output of the first inverter 136 is connected to the input of the second inverter 138, and the output of the second inverter 138 is connected to the GMAT precharge signal line 158 via the GMAT precharge driver 142. In some embodiments, the delay circuit 130 is connected between the LMAT precharge signal line 156 and the GMAT precharge signal line 158 via the precharge driver 122.

Figure 2:
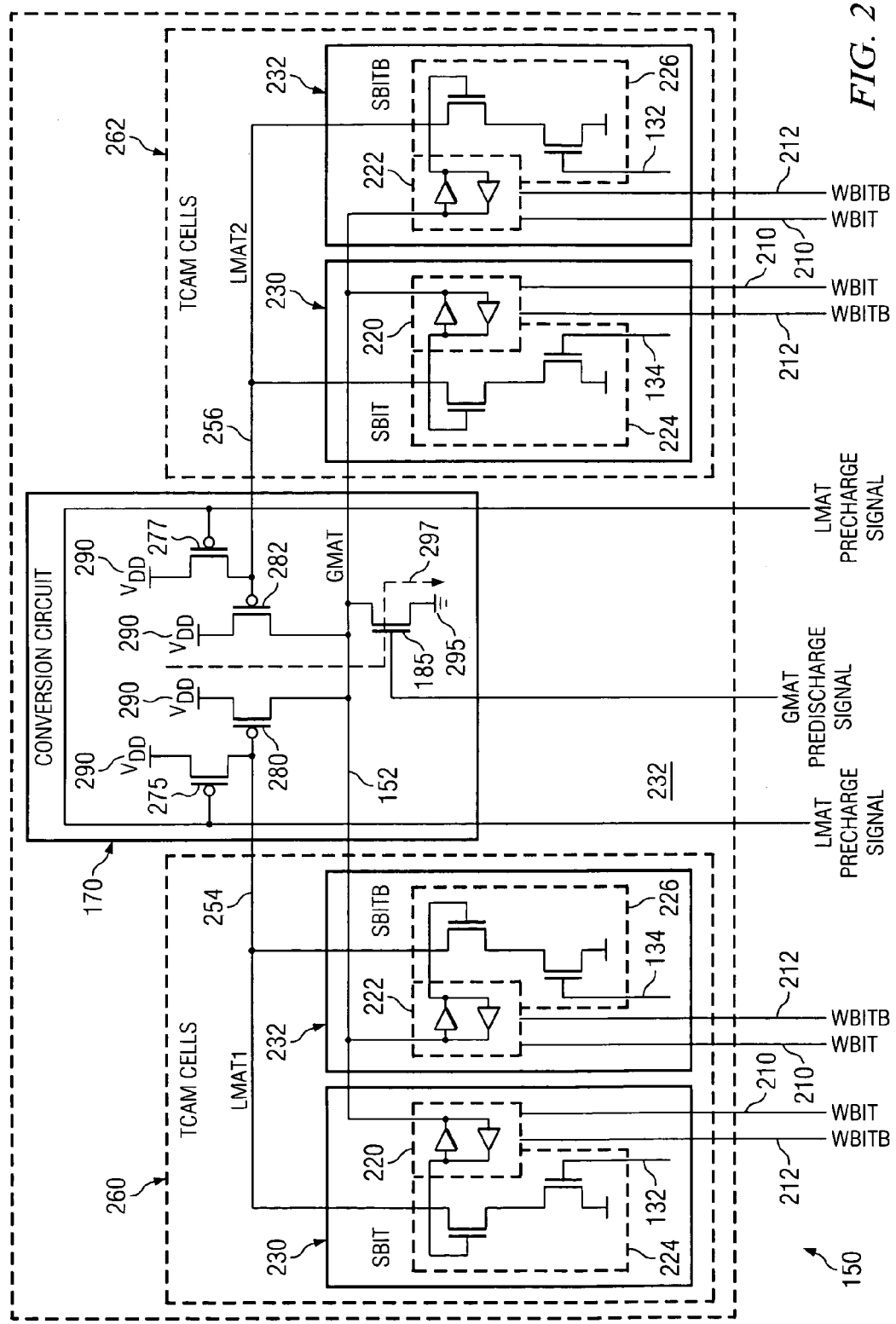
FIG. 2 is a schematic diagram of one or more TCAM cells and its associated conversion circuitry located in each CAM block of a CAM block array according to an embodiment of the present invention, such as those shown in FIG. 1.

Referring now to FIG. 2, there is illustrated an example embodiment of the CAM block 150 according to the present subject matter. As shown in FIG. 2, the CAM block 150 includes the conversion circuit 170, a first group of TCAM cells 260, a second group of TCAM cells 262, the GMAT line 152, a first LMAT line 254, and a second LMAT line 256. In some embodiments, each of the first and the second groups of TCAM cells 260 and 262 has 2 or more TCAM cells.

Further as shown in FIG. 2, the conversion circuit 170 includes a first and a second LMAT precharge transistors 275 and 277, a first and a second GMAT evaluation transistors 280 and 282, and the GMAT predischarge transistor 185. In some embodiments, the first and the second LMAT precharge transistors 275 and 277 are a first and a second pull-up LMAT PMOS transistor, respectively. The first and the second GMAT evaluation transistors 280 and 282 are a first and a second pull-up GMAT PMOS transistor, respectively. The GMAT predischarge transistor 185 is a GMAT NMOS transistor.

As shown in FIG. 2, the conversion circuit 170 is connected between the first group of TCAM cells 260 and the second group of TCAM cells 262. In these embodiments, the first LMAT line 254 is connected to the first group of TCAM cells 260 and the second LMAT line 256 is connected to the second group of TCAM cells 262.

Also as shown in FIG. 2, the first LMAT precharge transistor 275 is connected between an input voltage terminal 290 and the first LMAT line 254 and the second LMAT precharge transistor 277 is connected between the input voltage terminal 290 and the second LMAT line 256. Further as shown in FIG. 2, the first and the second GMAT evaluation transistors 280 and 282 are connected between the input voltage terminal 290 and the GMAT line 152. Gates of the GMAT evaluation transistors 280 and 282 are connected to the first LMAT line and the second LMAT line 254 and 256, respectively. Also as shown in FIG. 2, the GMAT predischarge transistor 185 is connected between the GMAT line 152 and a ground terminal 295. Also in these embodiments, the first and the second LMAT lines 254 and 256 are connected to the GMAT line 152 via the first group of TCAM cells and the second group of TCAM cells 260 and 262 and the first and second GNAT evaluation transistors 280 and 282, respectively.

As shown in FIG. 2, TCAM cells in each of the first and the second groups of TCAM cells 260 and 262 are paired such that each pair has a first TCAM cell and a second TCAM cell 230 and 232, respectively. Also as shown in FIG. 2, each of the first TCAM cell and the second TCAM cell 230 and 232 has a first memory element and a second memory element 220 and 222 and a first comparison circuit and a second comparison circuit 224 and 226, respectively. The first memory element and the second memory element 220 and 222 and the first comparison circuit and the second comparison circuit 224 and 226 are further connected to a write data line and a write complement data line 210 and 212 and connected to the associated compare data line and the compare complement data line 132 and 134, respectively. In some embodiments, the first memory element and the second memory element 220 and 222 are SRAMs.

In operation, for example, when each TCAM cell associated with each column in the CAM block array 110 is queried, i.e., the stored data bit in each TCAM cell associated with each column is compared with a received compared data bit via the associated compared data line 132, and if the stored data bit is not equal to the received compare data bit, then a mismatch signal is driven via the first LMAT line 254 and the associated first GMAT evaluation transistor 280. Similarly, when each TCAM cell associated with each column in the CAM block array 110 is queried and if there is a match between the received compare data bit and the stored data bit, then each TCAM cell associated with each column maintains the associated LMAT line and the GMAT line 154 and 152 in a charged state to indicate the match condition. In response thereto, the conversion circuit 170 corresponding to a subsequent row turn on to reflect match conditions. On the other hand, if there is a mismatch condition in any of the TCAM blocks, the TCAM cells and conversion circuit 170 therein charge the associated GMAT line toward the VDD potential 290.

The GMAT line 152 is predischarged to ground 295 and the first LMAT line and the second LMAT line 254 and 256 in each of the multiple CAM blocks 150 in the CAM block array 110 are precharged to the supply voltage VDD for each and every compare operation. It can be seen in FIG. 2 that during such a precharge operation, for example, if the first GMAT predischarge transistor 297 is enabled and if any of the associated LMAT line 154 is still at logic low voltage, then there will be a direct path from the VDD to ground via the GMAT evaluation transistor 280 and the GMAT predischarge transistor 185, such a path is commonly referred to as a "crowbar" path 297, which can result in significant power consumption. In order to avoid such a condition, as shown in FIG. 1, during each precharge operation, the control block 120 controls the precharge driver 122 such that the precharge driver first precharges each LMAT line 154 in each of the multiple TCAM blocks 150 in the CAM block array 110. The delay circuit 130 then applies a predetermined amount of delay substantially after completing the precharging of each LMAT line associated with each of the multiple TCAM blocks 150. The delay circuit 130 then precharges the GMAT line in each of the multiple TCAM blocks 150 to substantially prevent the occurrence of the above-described crowbar path 297 during the precharge operation to prevent significant power consumption due to the crowbar path.

In some embodiments, the delay circuit 130 provides a predetermined amount of delay to precharge each GMAT line 152 in the CAM block array 110 substantially after precharging each LMAT line 154 in the CAM block array 110. In some embodiments, the predetermined amount of delay is equal to or greater than a time required for precharging an LMAT line 154 in the CAM block array 110.

Figure 3:
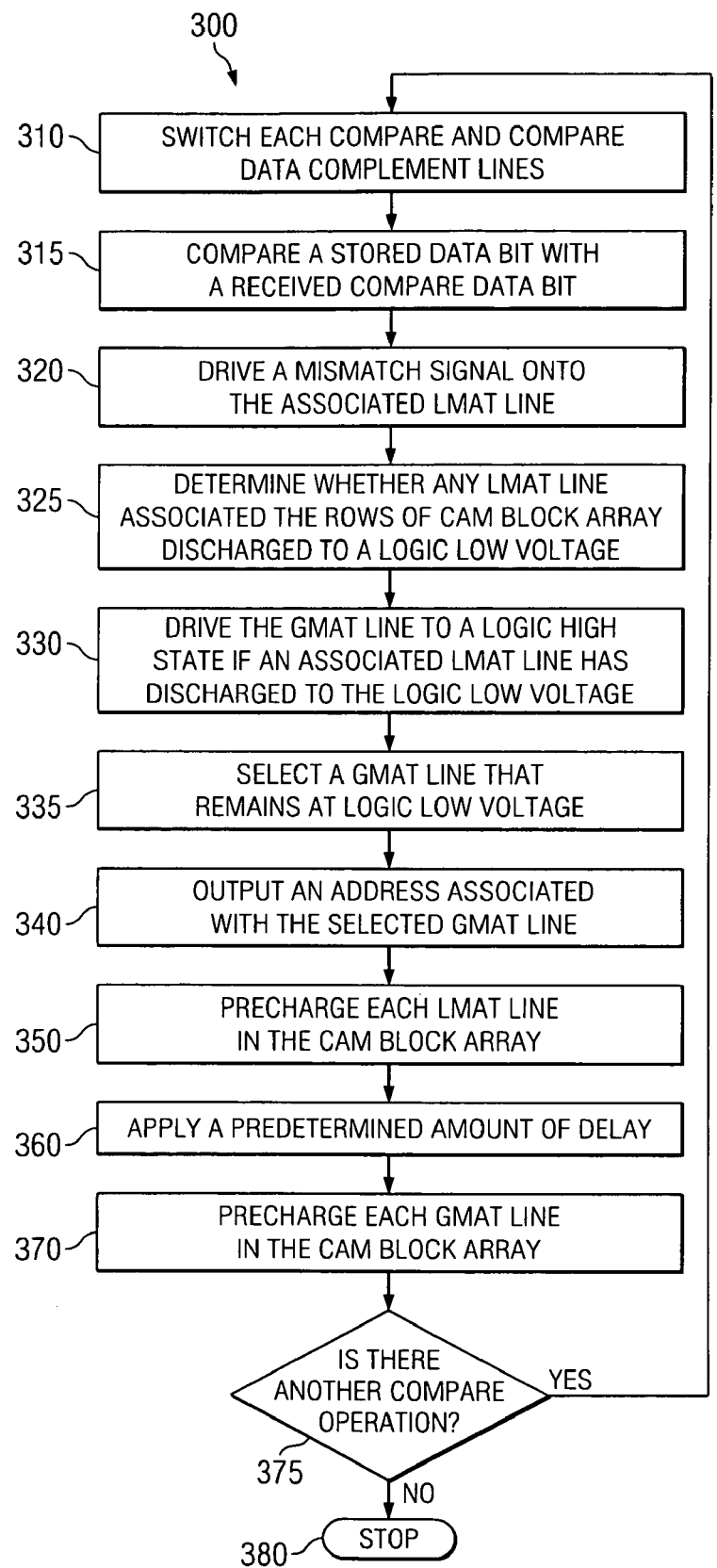
FIG. 3 is a flowchart illustrating an example method of performing a precharge operation in the conversion circuitry of FIG. 2.

FIG. 3 is a flowchart illustrating an example embodiment of a method 300 of performing a predischarge operation using the conversion circuitry associated with each TCAM cell in the CAM array shown in FIG. 2. The CAM block array is organized into at least one rectangular array having rows. Each row has a plurality of CAM blocks and an associated GMAT line. Each CAM block has an associated LMAT line and a group of CAM cells. At step 310, the method 300 in this example embodiment begins with each compare and compare data complement lines associated with each column in the CAM block array being switched to an active state to receive a compare data bit and compare complement data bit, respectively.

At step 315, a stored data bit is then compared with the received compare data bit in each of the group of CAM cells associated with the rows of the CAM block array. At step 320, a mismatch signal is driven onto the associated LMAT line when the stored data bit is not equal to the compare data bit.

At step 325, the method 300 determines whether any LMAT line associated with the rows of the CAM block array discharged to a logic low voltage. At step 330, the method 300 drives the GMAT line to a logic high state if an associated LMAT line has discharged to the logic low voltage. At step 335, the GMAT line that remains at the logic low voltage is selected. At step 340, an address associated with the selected GMAT line is outputted.

At step 350, the method 300 precharges each LMAT line in the CAM block array. At step 360, a predetermined amount of delay is applied substantially after precharging the each LMAT line. At step 370, each GMAT line in the CAM block array is precharged.

At step 375, the method 300 determines if there is there is another compare operation that needs to be performed. Based on the determination at step 375, if there is no other compare operation that needs to be performed the method 300 goes to step 380 and stops. Based on the determination at step 375, the method 300 goes to step 310 and repeats the steps 310–380 if there is another compare operation that needs to be performed.

The above-described predischarge operation performed on the CAM block array is explained in more detail with reference to FIGS. 1 and 2.

This process provides a replica tracking of cascaded match precondition to sequence the timing between LMAT and GMAT lines. The GMAT line precharge is derived from the LMAT line precharge by using a significantly smaller delay. This delay can be tuned to track as a function of time required to precharge an LMAT line in the CAM block array. Thus, the present invention provides a scheme that is independent of a compiler size. Since the delay used between precharging each LMAT line and each GMAT line in the CAM block array is substantially small, the technique performs the tracking well across process-voltage-temperature variations.

Distributed precharge devices are used to precharge the long GMAT line, which improve performance and area when compared with using a single large precharge device at one end. The distributed precharge devices provide a good slope at all points of the GMAT line. The number of precharge devices can be scaled with the memory configuration and therefore provides a reduction in required silicon area. The distributed precharge is inherently scalable, which provides an improved performance for the larger CAM block array configurations. In addition, performance is not compromised for smaller CAM block array configurations. Basically, the above-described technique works for all CAM block configurations without compromising performance at the cost of silicon area.

The above-described precharge operation for the CAM block array provides a significant reduction in preconditioning time for larger CAM block array configurations. In addition, the above-described technique provides a distributed preconditioning device that is scalable based on compiler needs. Further, the above architecture for the CAM requires less silicon area. Furthermore, the above technique significantly reduces the crowbar problems without increasing the silicon area. Moreover, the performance of the CAM is not compromised because the scheme is scalable as a function of compiler size.

The above-described methods and apparatus provide various schemes to precharge conversion circuitry associated with TCAM cells in a CAM array. It is expected that the above-described methods and apparatus can also be implemented for CAM cells as well.

While the present subject matter has been described with reference to static memory elements, it is anticipated that dynamic memory elements can also be used to store the data bits.

It is to be understood that the above description is intended to be illustrative, and not restrictive. Many other embodiments will be apparent to those of skill in the art upon reviewing the above description. The scope of the subject matter should, therefore, be determined with reference to the following claims, along with the full scope of equivalents to which such claims are entitled.

As shown herein, the present invention can be implemented in a number of different embodiments, including various methods, an apparatus, and a system. Other embodiments will be readily apparent to those of ordinary skill in the art. The elements, algorithms, and sequence of operations can all be varied to suit particular requirements. The operations described above with respect to the method illustrated in FIG. 3 can be performed in a different order from those shown and described herein.

FIGS. 1–3 are merely representational and are not drawn to scale. Certain proportions thereof may be exaggerated, while others may be minimized. FIGS. 1–3 illustrate various embodiments of the invention that can be understood and appropriately carried out by those of ordinary skill in the art.

It is emphasized that the Abstract is provided to comply with 37 C.F.R. § 1.72(b) requiring an Abstract that will allow the reader to quickly ascertain the nature and gist of the technical disclosure. It is submitted with the understanding that it will not be used to interpret or limit the scope or meaning of the claims.

In the foregoing detailed description of the embodiments of the invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of the embodiments of the invention, with each claim standing on its own as a separate preferred embodiment.

The above description is intended to be illustrative, and not restrictive. Many other embodiments will be apparent to those skilled in the art. The scope of the invention should therefore be determined by the appended claims, along with the full scope of equivalents to which such claims are entitled.

The invention claimed is:

1. A content addressable memory (CAM) block array, comprising:
    a multiple CAM blocks, wherein the multiple CAM blocks are organized into at least one rectangular array having rows, wherein each row has a plurality of CAM blocks and an associated GMAT line, wherein each column in the rectangular array has a compare data line and a compare complement data line, wherein each CAM block is associated with a row and a column of the CAM block array, and wherein each CAM block comprising:
        one or more CAM cells;
        an associated LMAT line connected to the one or more CAM cells and the associated GMAT line; and
        a conversion circuit having at least one LMAT precharge transistor connected between an input voltage terminal and the LMAT line, at least one GMAT evaluation transistor connected between the input voltage terminal and the GMAT line, and a GMAT predischarge transistor connected between the GMAT line and a ground terminal.

2. The CAM block array of claim 1, wherein each CAM cell comprising:
    at least one memory element for storing a data bit; and
    at least one comparison circuit for comparing the stored data bit with a received compare data, and for driving a mismatch signal onto the at least one LMAT precharge transistor when the stored data bit is not equal to the compare data bit.

3. The CAM block array of claim 2, wherein each column having an LMAT precharge signal line coupling each of the at least one LMAT precharge transistor, wherein each column having a GMAT precharge transistor connected to each GMAT line.

4. The CAM block array of claim 1, the one or more CAM cells comprise a plurality of TCAM cells.

5. The CAM block array of claim 1, wherein the at least one memory element is an SRAM cell.

6. A CAM comprising:
    a delay circuit;
    an LMAT precharge driver and a GMAT precharge driver; and
    a CAM block array including multiple CAM blocks, wherein the CAM block array is organized into at least one rectangular array having rows each having a plurality of CAM blocks and an associated GMAT line, wherein each column in the rectangular array has a compare data line and a compare complement data line, wherein each CAM block is associated with a row and a column of the CAM block array, and wherein each CAM block comprising:
a plurality of TCAM cells;
an associated LMAT line connected to the plurality of TCAM cells and the associated GMAT line; and
a conversion circuit having at least one LMAT precharge transistor connected between an input voltage terminal and the LMAT-line, at least one GMAT evaluation transistor connected between the input voltage terminal and the GMAT line, and a GMAT predischarge transistor connected between the GMAT line and a ground terminal, wherein each TCAM cell comprising:
a first memory element for storing a data bit; and
a first comparison circuit for comparing the stored data bit with a received compare data, and for driving a mismatch signal onto the at least one LMAT line when the stored data bit is not equal to the compare data bit, wherein each column having an LMAT line connected to the at least one LMAT precharge transistor, wherein each column having a GMAT line connecting each of the at least one GMAT evaluation transistor, and wherein the delay circuit is connected between the LMAT precharge signal line via the LMAT precharge driver and the GMAT precharge signal line via the GMAT precharge driver such that the delay circuit provides a predetermined amount of delay to precharge each of the at least one GMAT line substantially after pre-charging each of the at least one LMAT line in the CAM block array.

7. The CAM of claim 6, wherein the delay circuit comprises a first and a second delay inverters, wherein each of the first and the delay inverters comprise an input and an output, wherein the LMAT precharge signal line is connected to the input of the first delay inverter via the LMAT precharge driver, wherein the output of the first delay inverter is connected to the input of the second delay inverter, and wherein the output of the second delay inverter is connected to the GMAT precharge signal line via the GMAT precharge driver.

8. The CAM of claim 6, wherein the predetermined amount of delay comprises a delay that is substantially equal to or greater than a time required to precharge an LMAT line.

9. The CAM of claim 6, wherein the plurality of TCAM cells comprises a first and a second group of TCAM cells and wherein the conversion circuit is connected between the first and the second group of TCAM cells.

10. The CAM of claim 9, wherein each of the first and the second group of TCAM cells comprises 2 or more TCAM cells.

11. The CAM of claim 9, wherein the LMAT line comprise a first LMAT line and a second LMAT line and wherein the first LMAT line is connected to the first group of TCAM cells and the second LMAT line is connected to the second group of TCAM cells.

12. The CAM of claim 9, wherein the at least one LMAT precharge transistor comprises a first and a second LMAT precharge transistors, the at least one GMAT evaluation transistor comprises a first and a second GMAT evaluation transistors, wherein the first LMAT precharge transistor is connected between the input voltage terminal and the first LMAT line and the second LMAT precharge transistor is connected between the input voltage terminal and the second LMAT line, and wherein the first and second GMAT evaluation transistors is connected between the input voltage terminal and the GMAT line.

13. The CAM of claim 9, wherein the first LMAT line and the second LMAT line are connected to the GMAT line via the first and the second GMAT evaluation transistor.

14. The CAM of claim 6, wherein the at least one LMAT precharge transistor, the at least one GMAT evaluation transistor, and the GMAT predischarge transistor comprises at least one pull-up LMAT PMOS transistor, at least one pull-up GMAT PMOS transistor, and a GMAT NMOS predischarge transistor, respectively.

15. The CAM of claim 6, wherein the each TCAM cell further comprises:
a second memory element for storing a complement data bit; and
a second comparison circuit that compares the stored complement data bit with a received compare complement data from the compare complement data line, and for driving a complement mismatch signal onto the at least one LMAT line when the stored complement data bit is not equal to the compare complement data bit.

16. The CAM of claim 15, wherein the first memory element and the second memory element are SRAM cells.

17. An apparatus comprising:
a delay circuit;
a precharge driver connected to the delay circuit; and
a CAM block array including multiple CAM blocks, wherein the CAM block array is organized into at least one rectangular array having rows each having a plurality of CAM blocks and an associated GMAT line, wherein each column in the rectangular array has a compare data line and a compare complement data line, wherein each CAM block is associated with a row and a column of the CAM block array, and wherein each CAM block comprising:
a plurality of CAM cells;
an associated LMAT line connected to the plurality of CAM cells and the associated GMAT line; and
a conversion circuit having at least one LMAT precharge transistor connected between an input voltage terminal and the LMAT line, at least one GMAT evaluation transistor connected between the input voltage terminal and the GMAT line, and a GMAT predischarge transistor connected between the GMAT line and a ground terminal, wherein each CAM cell comprising:
a first memory element for storing a data bit; and
a first comparison circuit for comparing the stored data bit with a received compare data, and for driving a mismatch signal onto the at least one LMAT precharge transistor when the stored data bit is not equal to the compare data bit, wherein each column having an LMAT precharge signal line connecting each of the at least one LMAT precharge transistor, wherein each column having a GMAT precharge signal line connecting each of the at least one GMAT evaluation transistor, and wherein the delay circuit is connected between the LMAT precharge signal line and the GMAT precharge signal line via the precharge driver such that the delay circuit provides a predetermined amount of delay to precharge each of the at least one GMAT evaluation transistors substantially after pre-charging each of the at least one LMAT precharge transistor in the CAM block array.

18. The apparatus of claim 17, wherein the delay circuit comprises a first and a second delay inverters, wherein the first and the delay inverters comprise an input and an output, wherein the LMAT precharge signal line is connected to the input of the first delay inverter, wherein the output of the first delay inverter is connected input of the second delay inverter, and wherein the output of the second delay inverter is connected to the GMAT precharge signal line.

19. The apparatus of claim 17, wherein the predetermined amount of delay comprises a delay that is substantially equal to or greater than a time required to precharge an LMAT line.

20. A method of pre-charging a CAM block array, wherein the CAM block array including a plurality of CAM blocks, wherein the CAM block array is organized into at least one rectangular array having rows each having a plurality of CAM blocks and an associated GMAT line, and wherein each CAM block having an associated LMAT line and a group of CAM cells comprising:
    precharging each LMAT line associated with each CAM block in the CAM block array;
    applying a predetermined amount of delay substantially after precharging each LMAT line; and
    precharging each GMAT line associated with each row in the CAM block array.

21. The method of claim 20, further comprising:
    switching each compare and compare data complement lines associated with each column in the CAM block array to an active state to receive a compare data bit and compare complement data bit, respectively;
    comparing a stored data bit with the received compare data bit in each of the group of CAM cells associated with the rows of the CAM block array;
    driving a first mismatch signal onto the associated LMAT line when the stored data bit is not equal to the compare data bit;
    determining whether any LMAT line associated with rows of the CAM block array failed to discharge; and
    if an associated LMAT line discharged to logic low voltage, then driving the GMAT line logic high voltage.

22. The method of claim 21, further comprising:
    selecting an associated GMAT line that remains in a logic low voltage; and
    outputting an address associated with the selected GMAT line.

23. The method of claim 20, wherein, in comparing, the CAM cells comprise TCAM cells.

* * * * *